United States Patent
Wu et al.

(10) Patent No.: US 6,797,611 B1
(45) Date of Patent: Sep. 28, 2004

(54) METHOD OF FABRICATING CONTACT HOLES ON A SEMICONDUCTOR CHIP

(75) Inventors: Kuo-Chien Wu, Miao-Li Hsien (TW); Yinan Chen, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/604,600

(22) Filed: Aug. 3, 2003

(51) Int. Cl.$^7$ .................... H01L 21/4763; H01L 23/48
(52) U.S. Cl. ............ 438/637; 438/638; 438/639; 438/649; 438/645; 438/644; 438/647; 438/648; 438/651; 438/654; 438/655; 438/658; 438/688; 438/682; 438/683; 438/723; 438/724; 438/586; 257/774
(58) Field of Search .................. 438/637, 638, 438/639, 644, 645, 647, 648, 649, 651, 654, 655, 658, 688, 682, 683, 723, 724, 714, 586; 257/774

(56) References Cited

U.S. PATENT DOCUMENTS

| | | | | |
|---|---|---|---|---|
| 6,091,154 A | * | 7/2000 | Ohkawa | 257/774 |
| 6,150,281 A | * | 11/2000 | Kwean | 438/724 |
| 6,235,619 B1 | * | 5/2001 | Miyakawa | 438/585 |
| 6,303,431 B1 | * | 10/2001 | Linliu | 438/253 |
| 6,642,114 B2 | * | 11/2003 | Nakamura | 438/279 |
| 6,649,955 B2 | * | 11/2003 | Lee | 257/295 |
| 2002/0025669 A1 | * | 2/2002 | Hwang et al. | 438/637 |

* cited by examiner

*Primary Examiner*—Matthew Smith
*Assistant Examiner*—Belur V Keshavan
(74) *Attorney, Agent, or Firm*—Winston Hsu

(57) ABSTRACT

A method of fabricating contact holes on a semiconductor chip with a plurality of gates and a first mask layer includes filling a dielectric layer into the inter-gate space of two gates, polishing the dielectric layer until the surface of the dielectric layer is coplanar with the gates, depositing a second mask layer, etching the second mask layer to form a bit line opening in an array area and simultaneously forming a gate opening and a substrate opening in a periphery area, removing a portion of the dielectric layer through the bit line opening and the substrate opening to form a bit line contact hole and a substrate contact hole, filling a metal layer into the bit line contact hole and the substrate contact hole, and etching the first mask layer through the gate opening to form a gate contact hole.

20 Claims, 9 Drawing Sheets

METHOD OF FABRICATING CONTACT HOLES ON A SEMICONDUCTOR CHIP

BACKGROUND OF INVENTION

1. Field of the Invention

The invention relates to a method of fabricating contact holes on a semiconductor chip, and more particularly, to a method only requiring a single photomask to fabricate bit line contact (CB) holes, substrate contact (CS) holes, and gate contact (CG) holes in an array area and a periphery area of a semiconductor chip.

2. Description of the Prior Art

Dynamic random access memory (DRAM) has become a key element of most electronic products. There are a large number of memory cells integrated to form an array area in a DRAM for storing information. The DRAM also comprises a periphery area for locating periphery controlling circuits. Each of the memory cells and the periphery controlling circuits comprises a metal oxide semiconductor (MOS) transistor and other electrical elements, such as a capacitor, in series. The MOS transistor is electrically connected to a word line while the capacitor is electrically connected to a bit line; together, they determine the address of a memory cell. For electrically connecting these electrical elements, contact holes are formed between various material layers so that subsequently formed conductive materials can be filled into the contact holes to complete the functionality of the MOS transistor.

Please refer to FIGS. 1–3, which are schematic diagrams of fabricating contact holes on a semiconductor chip 10 according to the prior art. The semiconductor chip 10 has a substrate 12, and the substrate 12 comprises an array area 14 and a periphery area 16. The array area 14 is used for locating each memory cell of a DRAM and has two gates 18, 20. The periphery area 16 is used for locating the periphery controlling circuits of the DRAM, which has a gate 22. Each of the gates 18, 20, 22 comprises an oxide layer (not shown), a conductive layer 24, a silicide layer 26, a mask layer 28, and a spacer 30. In a conventional method of fabricating the contact holes, a dielectric layer 32 is first deposited on the gates 18, 20, 22, and then, a doped polysilicon layer 34 is deposited on the dielectric layer 32 for being a hard mask of a following etching process. As shown in FIG. 2, a photoresist layer (not shown) is deposited on the doped polysilicon layer 34, and a first photomask CT is used to perform a photolithography-etching process (PEP) to remove a portion of the doped polysilicon layer 34 and the dielectric layer 32. Therefore, a bit line contact hole 36 is formed in the array area 14, and a gate opening 38 and a substrate contact hole 40 are simultaneously formed in the periphery area 16. Referring to FIG. 3, a second PEP is performed by using a second photomask CK to remove the mask layer 28 exposed by the gate opening 38, and thereby a gate contact hole 42 is formed. Then, a glue layer and a metal layer (not shown) are deposited, and an etchback process is performed to fill the metal layer into the bit line contact hole 36, the gate contact hole 38, and the substrate contact hole 40. Thus, subsequently formed elements and conductive lines can be electrically connected to the substrate 12 and the gate 22 through these contact holes.

In the prior art, when fabricating the bit line contact hole 36 of the array area 14 and the gate contact hole 42 and the substrate contact hole 40 of the periphery area 16, it is necessary to use two photomasks CT and CK and perform two photolithography processes, so that the whole fabricating process of these contact holes is very complicated and costs much money and time. In addition, it is a disadvantage to perform the photolithography process to the photoresist layer above the doped polysilicon layer 34, which is taken as a hard mask, according to the prior art. This is because the optical reflection of the doped polysilicon layer 34 is high and the contact holes have a high aspect ratio so that the photoresist layer may remain in the inter-gate space to cause contact holes to have defects, such as voids. Furthermore, the aspect ratio will become even higher as the integration is higher, resulting in the probability of voids occurring being much higher and reducing the yield of products.

SUMMARY OF INVENTION

It is therefore a primary objective of the claimed invention to provide a method of simultaneously fabricating bit line contact holes, substrate contact holes, and gate contact holes with low aspect ratio in an array area and a periphery area by a single photomask CT to solve the abovementioned problem.

According to the claimed invention, a method of fabricating contact holes on a semiconductor chip is disclosed. The semiconductor chip has a substrate comprising an array area for locating each memory cell of a DRAM and a periphery area for locating a periphery controlling circuit of the DRAM, wherein the array area and the periphery area contain at least a first gate and a second gate respectively. Each of the first gate and second gate comprises a first mask layer on a top surface and a spacer on a sidewall. The method comprises filling a dielectric layer into the inter-gate space of two gates; polishing, for example, using a chemical mechanical polishing process, the dielectric layer until the surface of the dielectric layer is coplanar with the top surface of the gates; depositing a second mask layer; etching the second mask layer to form a bit line opening in the array area and simultaneously forming a gate opening and a substrate opening in the periphery area; etching the dielectric layer through the bit line opening and the substrate opening until the substrate is exposed to form a bit line contact hole and a substrate contact hole; filling a metal layer into the bit line contact hole and the substrate contact hole; and etching the first mask layer through the gate opening to form a gate contact hole.

It is an advantage of the claimed invention that the method only uses a single photomask and one photolithography process to define the pattern of the bit line contact hole, gate contact hole, and the substrate contact hole, so that a total cost of the process can be reduced. In addition, the contact holes fabricated according to the claimed invention have a lower aspect ratio, and therefore voids can be avoided and product yields can be raised.

These and other objects of the claimed invention will be apparent to those of ordinary skill in the art after having read the following detailed description of the preferred embodiment that is illustrated in the various figures and drawings.

DETAILED DESCRIPTION

Figure 1:
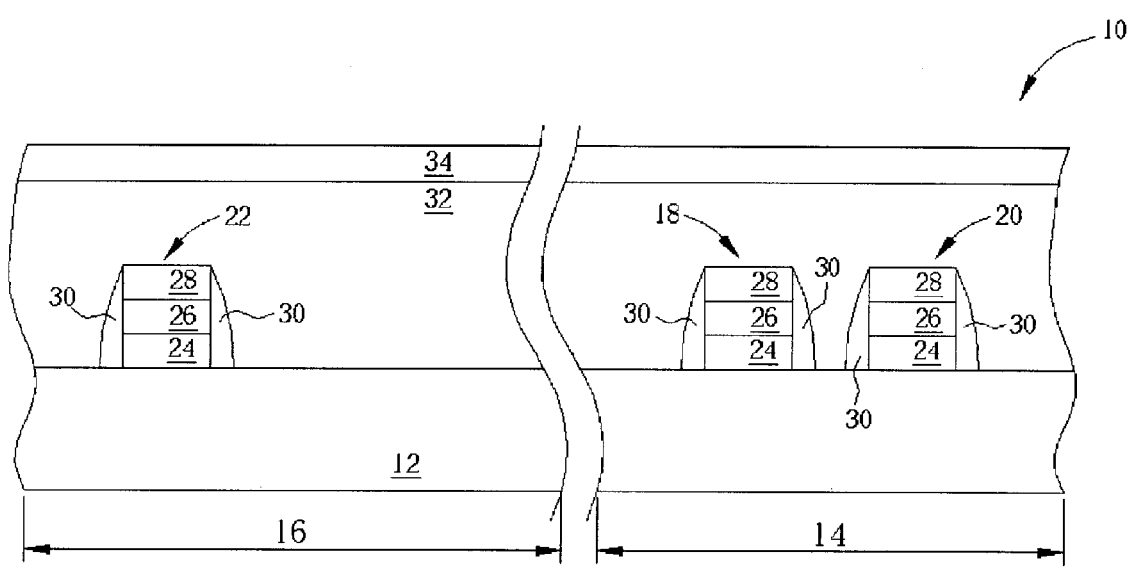
FIGS. 1–3 are schematic diagrams of fabricating contact holes on a semiconductor chip according to the prior art.
Figure 2:
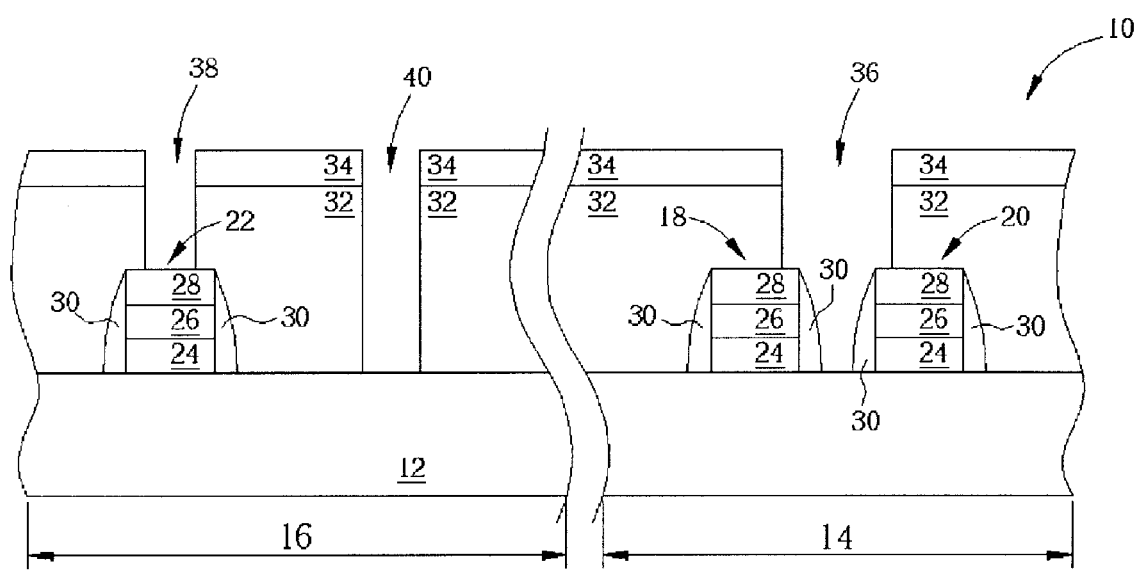
Figure 3:
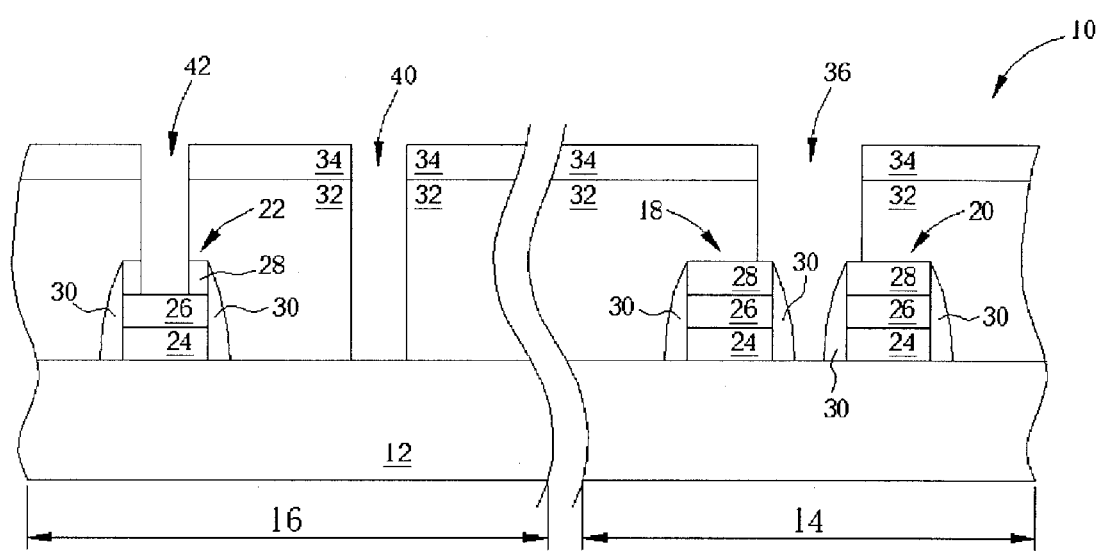
Figure 4:
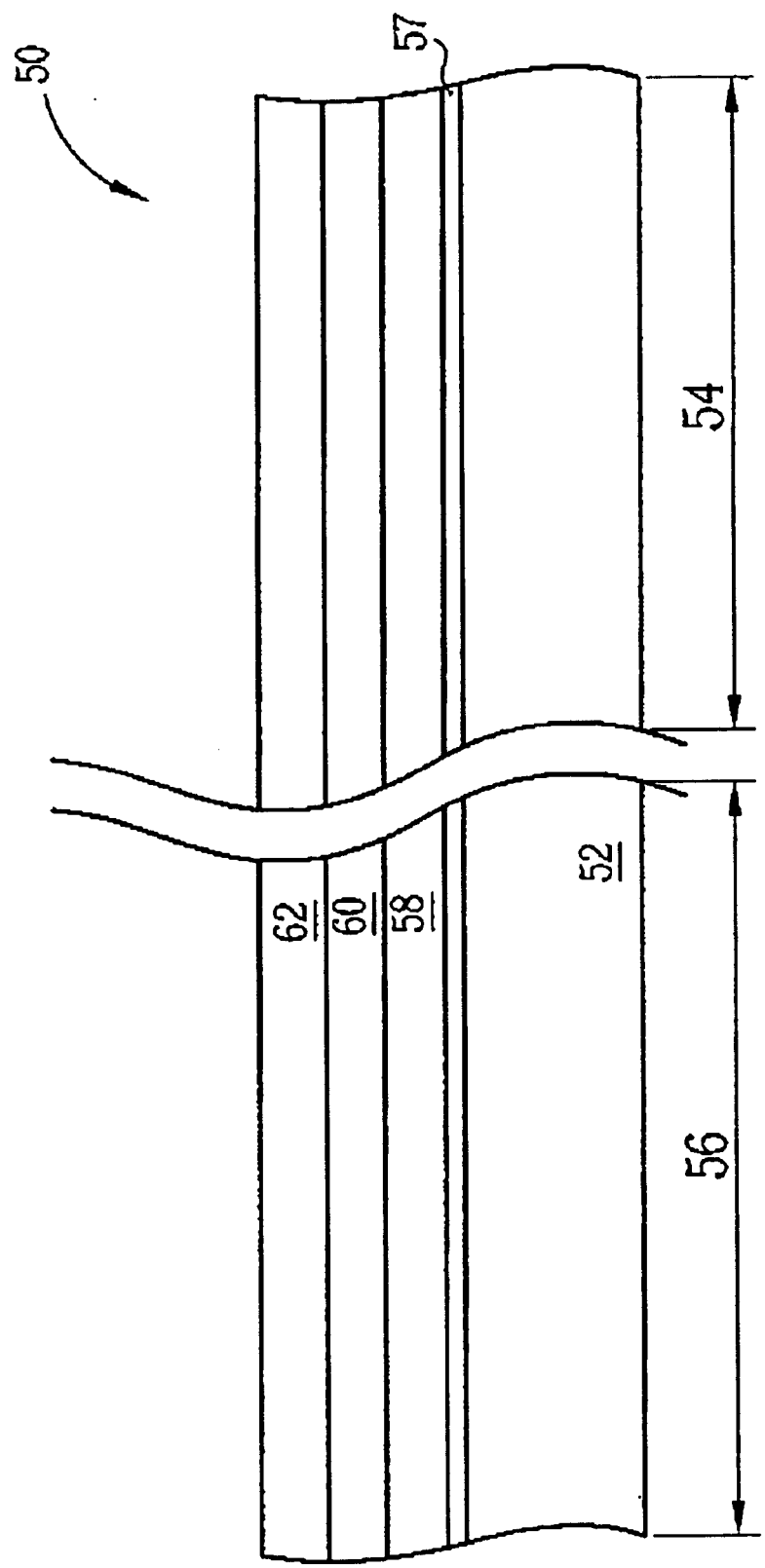
FIGS. 4–9 are schematic diagrams of fabricating contact holes on a semiconductor chip according to the present invention.

Please refer to FIGS. 4–9, which are schematic diagrams of fabricating contact holes on a semiconductor chip 50 according to the present invention. As shown in FIG. 4, the semiconductor chip 50 has a substrate 52 comprising an array area 54 and a periphery area 56. The array area 54 is used for locating memory cells of a DRAM, and the periphery area 56 is used for locating the periphery controlling circuits of the DRAM. The semiconductor chip 50 also has an oxide layer 57, a conductive layer 58, a silicide layer 60, and a first mask layer 62 on the substrate 52, wherein the oxide layer 57, composed of silicon dioxide (SiO2), serves as a gate oxide layer or a pad oxide layer of the ion implantation processes. The conductive layer 58 is composed of doped polysilicon. The first mask layer 62 can be formed by silicon nitride (SiN), silicon carbon (SiC), or silicon oxynitride (SiON). The forming method of the oxide layer 57, the conductive layer 58, the silicide layer 60, and the first mask layer 62 is well known to those skilled in the art, therefore no detailed description will be provided herein.

Figure 5:
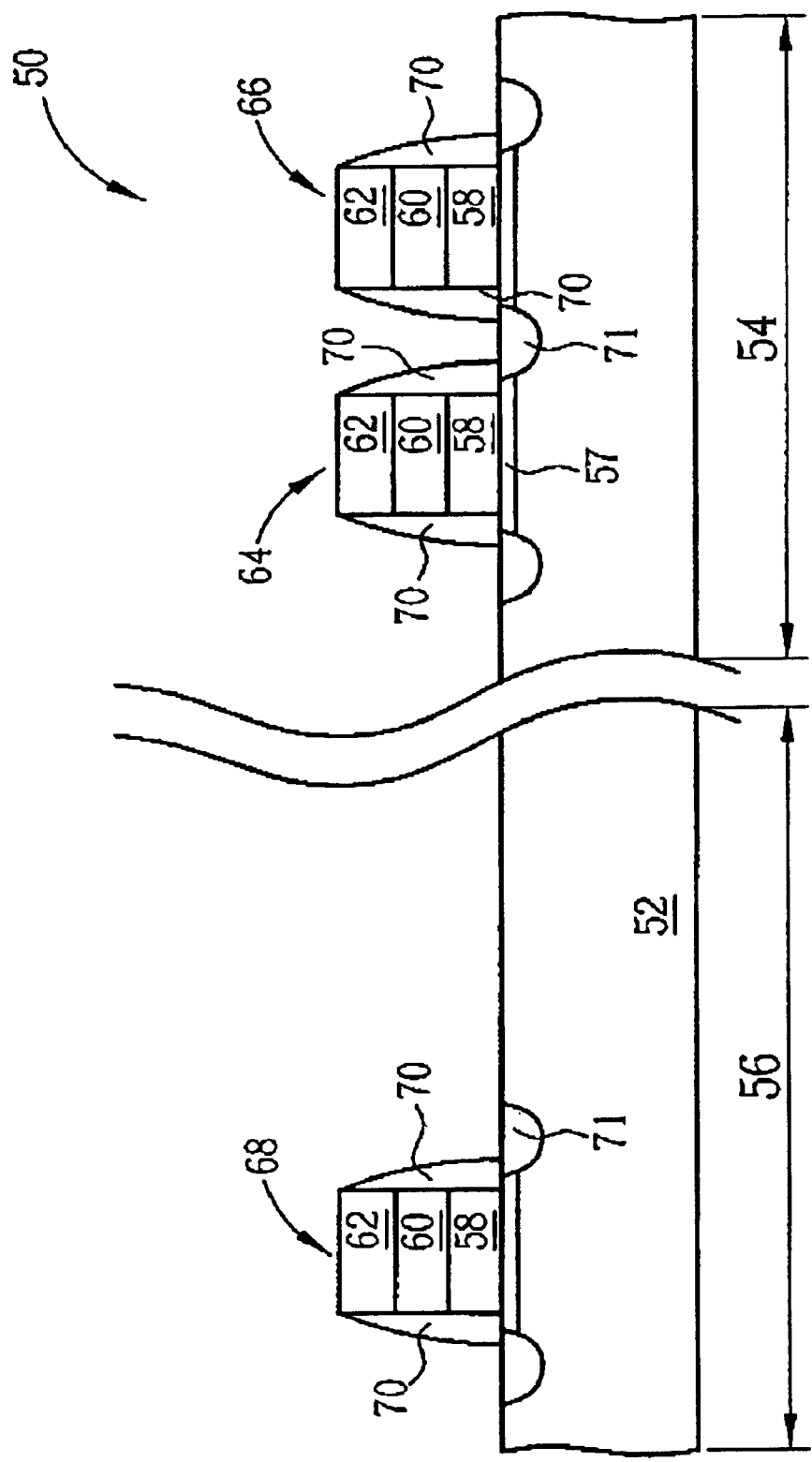

As shown in FIG. 5, before fabricating the contact holes, the gates of the memory cells and periphery controlling circuits have to be fabricated in the array area 54 and the periphery area 56 respectively. At first, a PEP is performed to remove a portion of the first mask layer 62, the silicide layer 60, and the conductive layer 58 to form two gates 64, 66 in the array area 54 and a gate 68 in the periphery area 56. After that, a silicon nitride layer is deposited, and is then etchbacked through an anisotropic etching process to form a spacer 70 on the sidewall of each of the gates 64, 66, 68. An ion implantation and a thermal annealing process are performed to form a source and a drain 71 of each of the gates 64, 66, 68.

Figure 6:
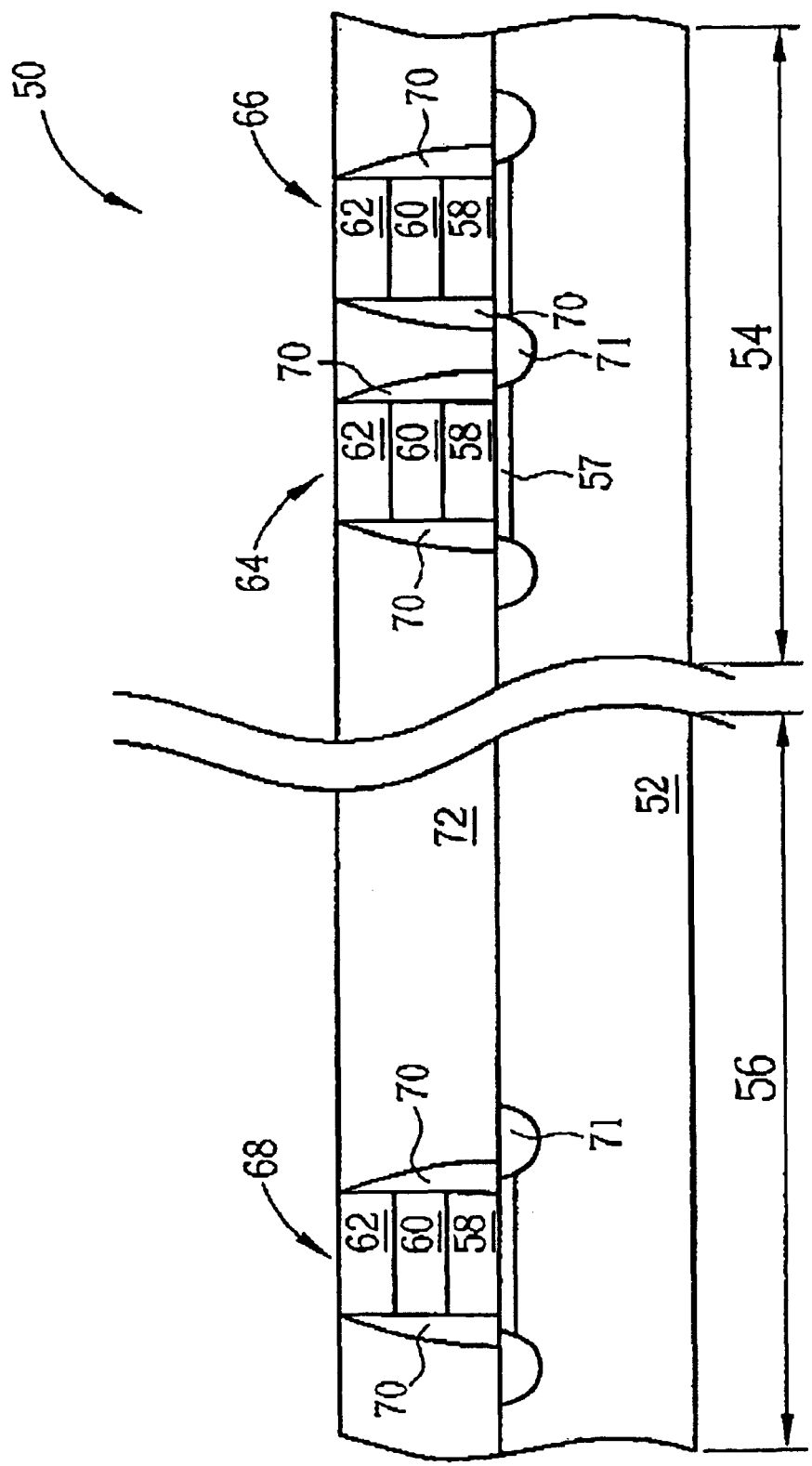

As shown in FIG. 6, a borophosphosilicate glass (BPSG) layer (not shown) is deposited on the semiconductor chip 50. A chemical mechanical polishing process is performed to polish the BPSG layer to the first mask layer 62, so that the surface of the BPSG layer is approximately coplanar with the surface of the gates 64, 66, 68. The BPSG layer is taken as an inter layer dielectric (ILD) layer 72 of the inter-gate space. In another embodiment of the present invention, the ILD layer 72 is composed of silicon dioxide.

Figure 7:
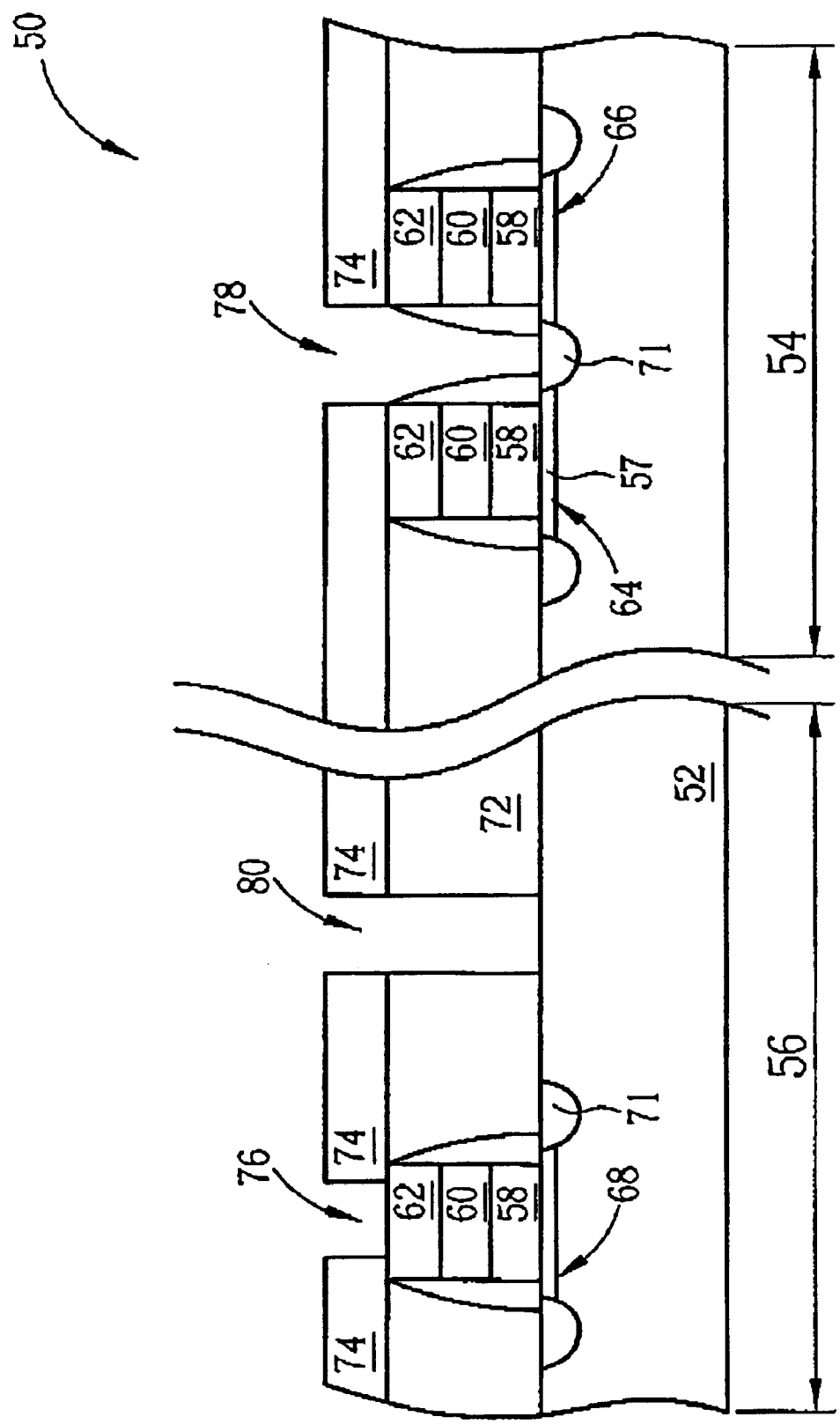

Referring to FIG. 7, a silicon nitride layer, which serves as a second mask layer 74, is deposited on the semiconductor chip 50. The thickness of the second mask layer 74 is greater or approximately equal to the thickness of the first mask layer 62. A photoresist layer (not shown) is formed on the second mask layer 74, and then a photo-mask CT is used to perform a photolithography process to define the pattern of the bit line contact hole, the substrate contact hole, and the gate contact hole on the photoresist layer. The following is to perform an etching process to remove the second mask layer 74 not covered by the photoresist layer for forming a bit line opening (not shown)in the array area 54 and a substrate opening (not shown) and a gate opening 76 in the periphery area 56. An etching process is performed to remove portions of the ILD layer 72 through the bit line opening and the substrate opening until the substrate 52 is exposed, and therefore a bit line contact hole 78 and a substrate contact hole 80 are formed. The second mask layer 74 may also comprise other nonconductive materials, such as silicon carbide or silicon oxynitride.

Figure 8:
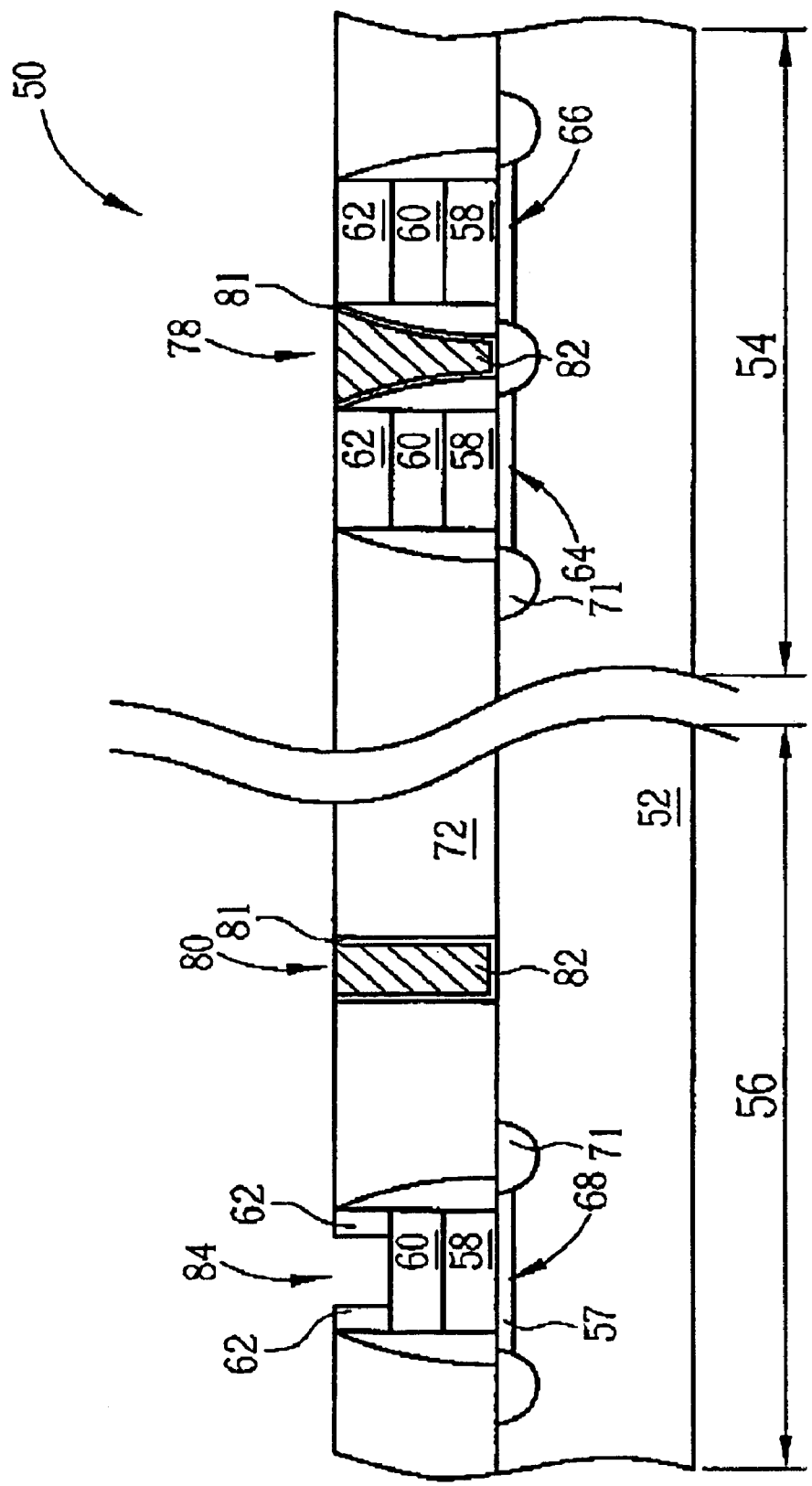

As shown in FIG. 8, a glue layer 81 is deposited and a metal layer 82, such as tungsten, is filled into the bit line contact hole 78 and the substrate contact hole 80. After that, a chemical mechanical polishing process or an etching process is performed to remove the metal layer 82 and the glue layer 81 above the second mask layer 74. As those skilled in the art may understand, the glue layer 81 is used for enhancing the adhesion force of the metal layer 82, and is composed of a titanium nitride (TiN) layer and a titanium (Ti) layer. Then, the second mask layer 74 is taken as a hard mask or an etching pad, and an etching process is performed for etching the first mask layer 62 through the gate opening 76 to thereby form a contact hole 84. It should be noted that the first mask layer 62 and the second mask layer 74 are both removed by this etching process if the first mask layer 62 and the second mask layer 74 are composed of the same material. However, the main objective of this etching process is to remove the first mask layer 62 of the gate 68 not covered by the second mask layer 74. As a result, when the second mask layer 74 is thicker than or equal to the first mask layer 62, the main objective can be matched. That means although the second mask layer 74 may also be removed through this etching process, the first mask layer 62 on the top of the gates 64, 66 will not be damaged. According to another embodiment of the present invention, the first mask layer 62 and the second mask layer 74 are formed of different materials, and therefore an etching selectivity can be adjusted to only remove the first mask layer 62 not covered by the second mask layer 74 and leave the second mask layer 74 whole. Thus, the thickness of the second mask layer 74 does not have to be greater than that of the first mask layer 62.

Figure 9:
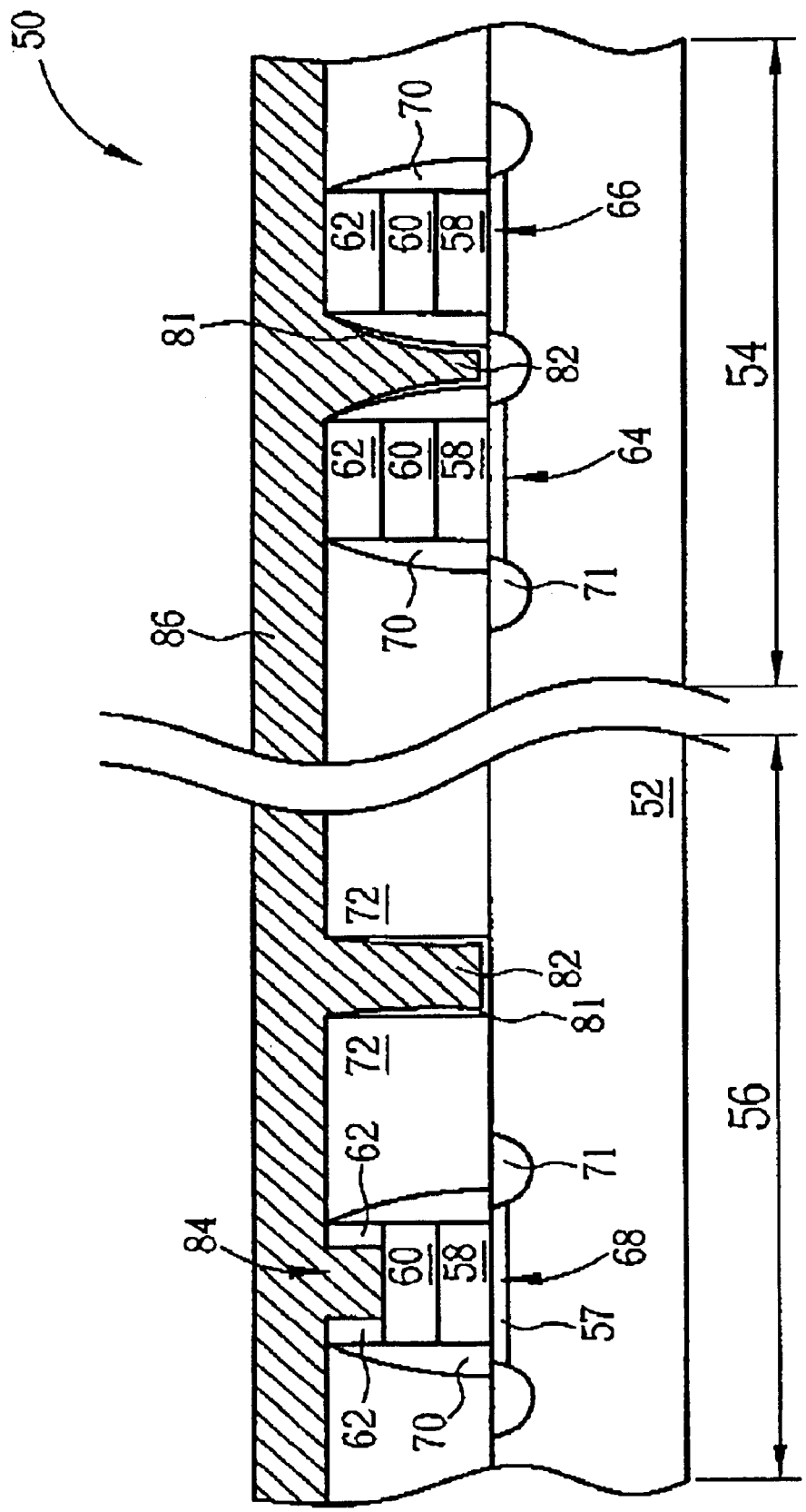

As shown in FIG. 9, a second oxide layer (not shown) is then deposited on the semiconductor chip 50 and is polished by a chemical mechanical polishing process. A PEP is performed to define the pattern of a bit line. Finally, a metal material is filled into the pattern of the bit line, and the metal layer is etchbacked or polished until the surface of the metal layer is approximately coplanar with the surface of the second oxide layer. Thus, the fabrication of the bit line contact hole 86 is completed.

In contrast to the prior art, the present invention only uses a single photomask CT to define the patterns of the gate contact hole, substrate contact hole, and bit line contact hole on the semiconductor chip.Therefore, the cost of photomasks and other process materials and time spent during fabrication can be effectively saved. Furthermore, the aspect ratio of the contact holes fabricated according to the present invention is smaller so that the photoresist layer will not remain in those contact holes, which results in voids. Thus, the yield of the semiconductor product can be increased.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating contact holes on a semiconductor chip, the semiconductor chip having a substrate comprising:

an array area for locating each memory cell of a dynamic random access memory (DRAM), the array area containing at least a first gate; and a periphery area for locating a periphery controlling circuit of the DRAM, the periphery area containing at least a second gate;

wherein the first and the second gates comprise a first mask layer on a top surface and a spacer on a sidewall, the method comprising the following steps:

filling a dielectric layer into an inter-gate space;

polishing the dielectric layer to the first mask layer so that a surface of the dielectric layer is approximately coplanar with a surface of the first and second gates;

depositing a second mask layer;

etching the second mask layer to form a bit line opening in the array area, and simultaneously forming a gate opening and a substrate opening in the periphery area;

etching the dielectric layer through the bit line opening and the substrate opening until a portion of the substrate is exposed so that a bit line contact hole and a substrate contact hole are formed;

filling a metal layer into the bit line contact hole and the substrate contact hole; and etching the first mask layer through the gate opening.

2. The method of claim 1, wherein each of the first and the second gates comprise a conductive layer and a silicide layer.

3. The method of claim 2, wherein the conductive layer is composed of doped polysilicon.

4. The method of claim 2, wherein the substrate contains a gate oxide layer below the first and the second gates.

5. The method of claim 4, wherein the gate oxide layer is composed of silicon dioxide ($SiO_2$).

6. The method of claim 1, wherein a glue layer is formed before filling the metal layer into the bit line contact hole and the substrate contacthole.

7. The method of claim 6, wherein the glue layer is composed of a titanium nitride (TiN) layer and a titanium (Ti) layer.

8. The method of claim 1, wherein the first and second mask layers are composed of silicon nitride (SiN), silicon carbon (SiC), or silicon oxynitride(SiON).

9. The method of claim 1, wherein the dielectric layer is composed of silicon dioxide.

10. The method of claim 1, wherein the dielectric layer is composed of borophosphosilicate glass (BPSG).

11. The method of claim 1, wherein a thickness of the second mask layer is approximately equal to or greater than a thickness of the first mask layer.

12. A method of fabricating contact holes on a semiconductor chip, the semiconductor chip having a substrate comprising:

an array area for locating each memory cell of a DRAM; and a periphery area for locating a periphery controlling circuit of the DRAM;

wherein the substrate has an oxide layer, a conductive layer, a silicide layer, and a first mask layer thereon, the method comprising the following steps:

removing a portion of the first mask layer, the silicide layer, and the conductive layer to form at least a first gate in the array area and at least a second gate in the periphery array;

forming a spacer on a sidewall of the first and the second gates;

forming a source and a drain at two sides of the first and the second gates;

filling an inter dielectric layer (ILD) into an inter-gate space;

polishing the ILD layer to make the surface of the ILD layer approximately coplanar with the surface of the first mask layer;

depositing a second mask layer, wherein a thickness of the second mask layer is approximately equal to or more than a thickness of the first mask layer;

forming a bit line opening on the second mask layer in the array area, and simultaneously forming a gate opening and a substrate opening on the second mask layer in the periphery area;

removing a portion of the ILD layer through the bit line opening and the substrate opening until a portion of the substrate is exposed, so that a bit line contact hole and a substrate contact hole are formed;

filling a metal layer into the bit line contact hole and the substrate contact hole; and etching the first mask layer through the gate opening to form a gate contact hole on the second gate.

13. The method of claim 12, wherein a glue layer is formed before filling the metal layer into the bit line contact hole and the substrate contact hole.

14. The method of claim 13, wherein the glue layer is composed of a titanium nitride (TiN) layer and a titanium (Ti) layer.

15. The method of claim 12, wherein the oxide layer is composed of silicon dioxide.

16. The method of claim 12, wherein the conductive layer is composed doped polysilicon.

17. The method of claim 12, wherein the first mask layer is composed of silicon nitride, silicon carbon, or silicon oxynitride.

18. The method of claim 12, wherein the second mask layer is composed of silicon nitride, silicon carbon, or silicon oxynitride.

19. The method of claim 12, wherein the ILD layer is composed of silicon dioxide.

20. The method of claim 12, wherein the ILD layer is composed of borophosphosilicate glass.

* * * * *